(12) United States Patent
Kim

(10) Patent No.: US 8,291,363 B2
(45) Date of Patent: Oct. 16, 2012

(54) METHOD OF MEASURING SETUP TIME WITH CONSIDERATION OF CHARACTERISTIC OF ABSORBING CLOCK SKEW IN A PULSE-BASED FLIP-FLOP

(75) Inventor: Min-Su Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 329 days.

(21) Appl. No.: 12/693,146

(22) Filed: Jan. 25, 2010

(65) Prior Publication Data

US 2010/0201344 A1      Aug. 12, 2010

(30) Foreign Application Priority Data

Feb. 9, 2009   (KR) .................. 10-2009-0010220

(51) Int. Cl.
   *G06F 17/50*      (2006.01)
(52) U.S. Cl. .................. 716/108; 716/113; 716/136
(58) Field of Classification Search .................. 716/108, 716/113, 136; 324/76.77; 327/198, 210, 327/211, 215, 218
See application file for complete search history.

(56) References Cited

U.S. PATENT DOCUMENTS

| 6,407,583 | B2 | 6/2002 | Saito |
| 6,433,603 | B1 * | 8/2002 | Singh et al. .................. 327/211 |
| 2002/0138717 | A1 * | 9/2002 | Joy et al. .................. 712/235 |
| 2003/0212972 | A1 | 11/2003 | Tran |
| 2008/0141198 | A1 | 6/2008 | Chen et al. |

* cited by examiner

*Primary Examiner* — Vuthe Siek
(74) *Attorney, Agent, or Firm* — Myers Bigel Sibley & Sajovec, P.A.

(57) ABSTRACT

A method of measuring setup time measures a first delay time from an input signal to a clock signal and a second delay time from the clock signal to an output signal, and determines a setup time using the first delay time and the second delay time. The method of measuring setup time is used in designing a semiconductor IC including a pulse-based flip-flop circuit. The semiconductor IC designed by using the method of measuring setup time absorbs a clock jitter and allows a time borrowing between adjacent pipelines.

8 Claims, 16 Drawing Sheets

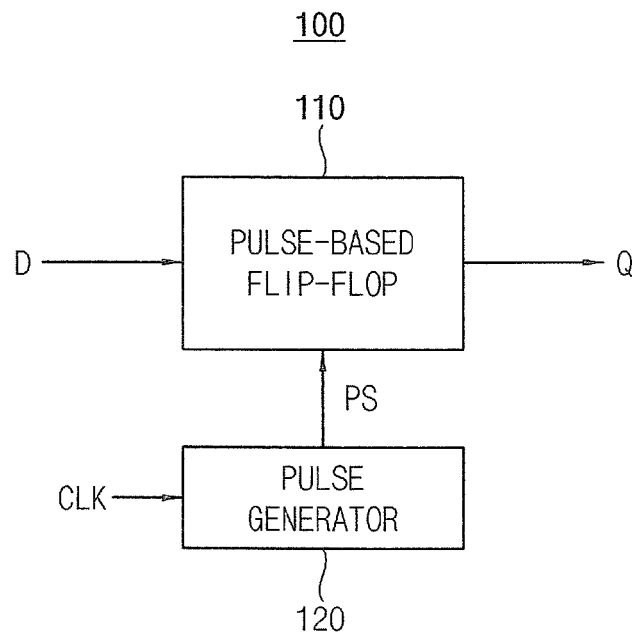
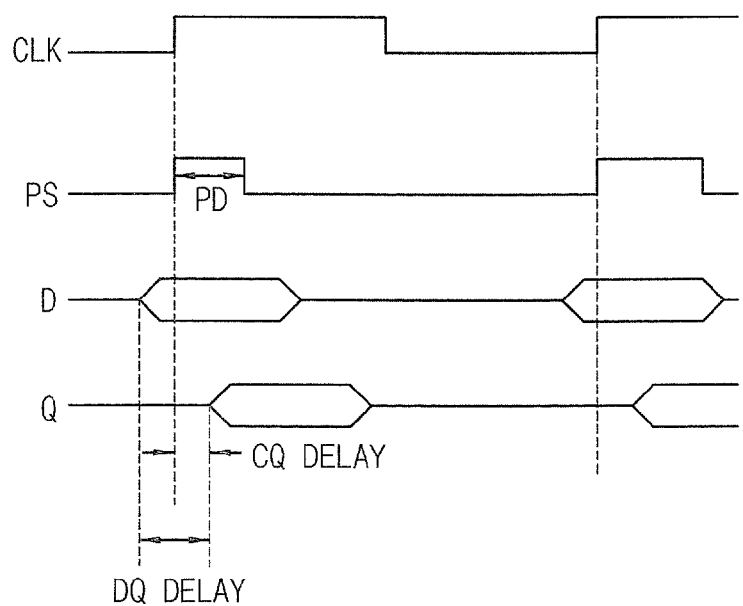

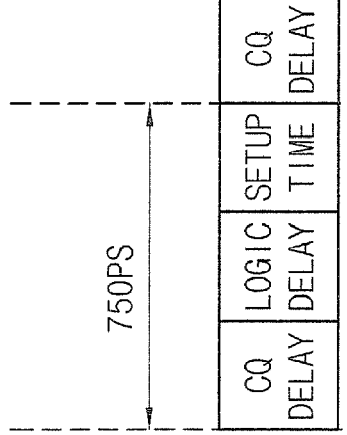
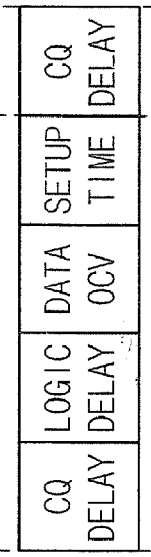
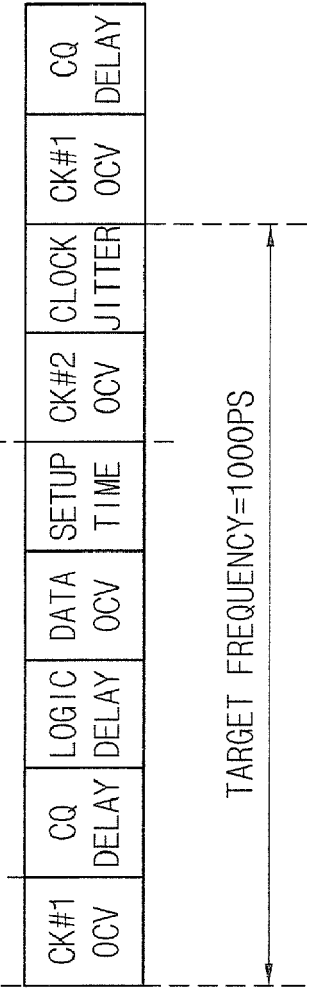
FIG. 6A
FIG. 6B
FIG. 6C

FIG. 19A

| SETUP TIME, old | | CONSTRAINT:D | | |
|---|---|---|---|---|
| | | 19ps | 97ps | 346ps |
| RELATED :CLK | 19ps | −18ps | 16ps | 88ps |
| | 56ps | −39ps | −5ps | 67ps |
| | 173ps | −95ps | −61ps | 12ps |

FIG. 19B

| SETUP TIME, new | | CONSTRAINT:D | | |
|---|---|---|---|---|
| | | 19ps | 97ps | 346ps |
| RELATED :CLK | 19ps | −169ps | −136ps | −64ps |
| | 56ps | −188ps | −155ps | −83ps |
| | 173ps | −238ps | −205ps | −134ps |

FIG. 19C

| WIDTH OF TRANSPARENCY | | CONSTRAINT:D | | |
|---|---|---|---|---|
| | | 19ps | 97ps | 346ps |
| RELATED :CLK | 19ps | 143ps | 142ps | 138ps |
| | 56ps | 141ps | 141ps | 136ps |
| | 173ps | 135ps | 134ps | 132ps |

METHOD OF MEASURING SETUP TIME WITH CONSIDERATION OF CHARACTERISTIC OF ABSORBING CLOCK SKEW IN A PULSE-BASED FLIP-FLOP

REFERENCE TO PRIORITY APPLICATION

This application claims priority to Korean Patent Application No. 2009-0010220, filed Feb. 9, 2009, the contents of which are hereby incorporated herein by reference.

FIELD OF THE INVENTION

This invention relates to measurement of characteristics in semiconductor devices and, more particularly, to methods of measuring setup times with consideration of characteristics of absorbing clock skews in pulse-based flip-flops.

BACKGROUND

In general, a standard cell library is used in designing a semiconductor integrated circuit (IC). The semiconductor IC designed by using a standard cell library, such as a system on chip, includes a data path that includes a plurality of stages, such that each stage has a flip-flop circuit and a logic circuit. A master-slave flip-flop including serially connected two latches or a pulse-based flip-flop including only one latch may be used as the flip-flop circuit of each stage of the data path.

Setup time of the pulse-based flip-flop is relatively short since the pulse-based flip-flop includes only one latch, and thus a semiconductor chip including the pulse-based flip-flop may operate at a high speed. The pulse-based flip-flop operates with edge-triggered like the master-slave flip-flop. In addition, since the pulse-based flip-flop has a transparency such that input data is transferred to a latch during an ON period of a pulse, the semiconductor IC including the pulse-based flip-flop has a characteristic of absorbing a clock skew and allows time borrowing between stages.

However, it has been difficult to describe a setup time due to a transparency of the pulse-based flip-flop accurately in a semiconductor IC design using a standard cell library.

SUMMARY

Example embodiments are directed to provide a method of measuring setup time representing a transparency of a pulse-based flip-flop in designing a semiconductor IC.

In a method of measuring setup time of a pulse-based flip-flop according to some example embodiments, a first delay time from an input signal to a clock signal and a second delay time from the clock signal to an output signal are measured and a setup time is determined using the first delay time and the second delay time.

The first delay time and the second delay time may be measured by measuring the second delay time when the first delay time is sufficiently large and determining the second delay time as an initial second delay time and measuring the second delay time while decreasing the first delay time.

The first delay time, at which the second delay time is increased by 10% from the initial second delay time, may be determined as the setup time.

The setup time may be determined by summing the first delay time and the second delay time, determining whether the sum of the first delay time and the second delay time is minimum, re-measuring the first delay time and the second delay time when the sum of the first delay time and the second delay time is not minimum, and determining the first delay time as the setup time when the sum of the first delay time and the second delay time is minimum.

The setup time may be determined by multiplying the first delay time by two, determining whether a sum of two times of the first delay time and the second delay time is minimum, re-measuring the first delay time and the second delay time when the sum of two times of the first delay time and the second delay time is not minimum, and determining the first delay time as the setup time when the sum of two times of the first delay time and the second delay time is minimum.

The first delay time and the second delay time may be measured by measuring the second delay time when the first delay time is sufficiently large and determining the second delay time as a first CQ delay and measuring the second delay time while decreasing the first delay time.

The setup time may be determined by determining the first delay time, at which the second delay time is increased by 10% from the first CQ delay, as a first setup time, determining a temporary delay time by adding the first CQ delay multiplied by 1.1 to the first setup time, measuring a third delay time from the input signal to the output signal while decreasing the first delay time, determining whether the third delay time is less than or equal to the temporary delay time, re-measuring the third delay time when the third delay time is greater than the temporary delay time, determining whether the first delay time is minimum when the third delay time is less than or equal to the temporary delay time, re-measuring the third delay time when the first delay time is not minimum and determining the first delay time as the setup time when the first delay time is minimum.

In a method of measuring setup time of a pulse-based flip-flop according to some example embodiments, a first delay time from an input signal to a clock signal, a second delay time from the clock signal to an output signal, and a third delay time from the input signal to the output signal are measured, and setup time is determined using the first delay time, the second delay time, and the third delay time.

The first delay time, the second delay time, and the third delay time may be measured by measuring the second delay time and the third delay time when the first delay time is sufficiently large and determining the second delay time as an initial second delay time and measuring the second delay time and the third delay time while decreasing the first delay time.

The setup time may be determined by determining the first delay time, at which the second delay time is increased by 10% from the initial second delay time, as a first setup time, measuring the third delay time while decreasing the first delay time, determining the first delay time, at which the third delay time is increased by 5% from the value when the first delay time is at the first setup time, as a second setup time, and determining a sum of the second setup time and a time, which is taken for the third delay time to decrease by 5% from the value when the first delay time is at the second setup time, as the setup time.

BRIEF DESCRIPTION OF THE DRAWINGS

FIG. 1 is a block diagram illustrating a pulse-based flip-flop circuit.

FIG. 2 is a timing diagram illustrating an operation of a pulse-based flip-flop of FIG. 1.

FIGS. 6A to 6C are diagrams illustrating delay times according to an operation condition of a circuit including a flip-flop.

FIGS. 19A to 19C are tables illustrating measurement results of setup time and a width of transparency of a pulse-based flip-flop circuit using a method of FIGS. 17 and 18.

DETAILED DESCRIPTION OF THE EMBODIMENTS

Figure 3:
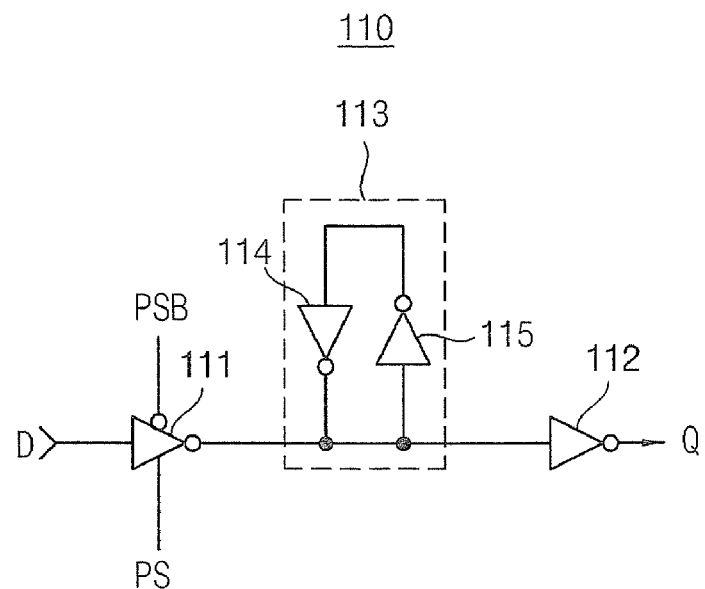
FIG. 3 is a circuit diagram illustrating an example of a pulse-based flip-flop in FIG. 1.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a pulse-based flip-flop circuit 100.

Referring to FIG. 1, the pulse-based flip-flop circuit 100 may include a pulse-based flip-flop 110 and a pulse generator 120.

The pulse generator 120 generates a pulse signal PS having a fixed pulse width in response to a clock signal CLK.

The pulse-based flip-flop 110 samples an input signal D and generates an output signal Q in response to the pulse signal PS.

FIG. 2 is a timing diagram illustrating an operation of the pulse-based flip-flop 110 of FIG. 1.

Referring to FIG. 2, the pulse signal PS may be generated in synchronization with a rising edge of the clock signal CLK and have a fixed pulse width PD. A delay time from an assertion of the input signal D to an assertion of the output signal Q is DQ DELAY and a delay time from an assertion of the clock signal CLK to an assertion of the output signal Q is CQ DELAY.

FIG. 3 is a circuit diagram illustrating an example of the pulse-based flip-flop 110 in FIG. 1.

Referring to FIG. 3, the pulse-based flip-flop 110 may include a first inverter 111, a second inverter 112 and a latch 113.

The first inverter 111 may be a tri-state inverter that is turned on or turned off in response to the pulse signal PS and an inverted pulse signal PSB, and output an inversion signal of the input signal D while the first inverter is turned on. As such, the pulse-based flip-flop 110 has a transparency such that input signal D is transferred to the latch 113 during an ON period of the pulse signal PS. The latch 113 may hold a logic state of an output signal of the first inverter 111. The second inverter 112 may invert the latched logic state and generate the output signal Q. The latch 113 may include a third inverter 114 and a fourth inverter 115 that are cross-coupled as shown in FIG. 3.

Figure 4:
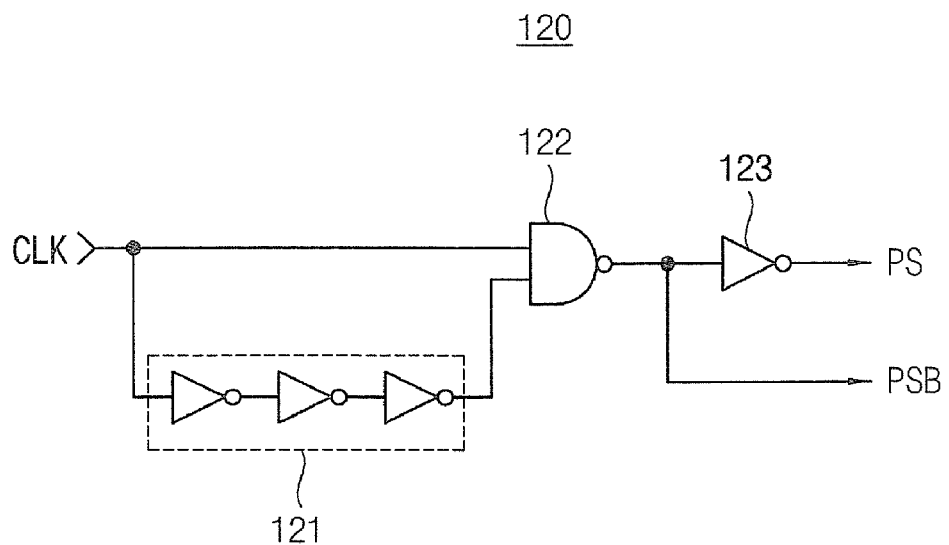
FIG. 4 is a circuit diagram illustrating an example of a pulse generator in FIG. 1.

FIG. 4 is a circuit diagram illustrating an example of the pulse generator 120 in FIG. 1.

Referring to FIG. 4, the pulse generator 120 may include a delay circuit 121, a NAND gate 122 and a fifth inverter 123.

The delay circuit 121 may include an odd number of inverters and delay the clock signal CLK. The delay time of the delay circuit 121 corresponds to the pulse width PD of the pulse signal PS. The NAND gate 122 may performs a NAND operation on the clock signal CLK and an output signal of the delay circuit 121. The fifth inverter 123 may invert a logic state of an output signal of the NAND gate 122 and generate the pulse signal PS. The NAND gate 122 may generate the inverted pulse signal PSB.

Referring to FIGS. 1 to 4, the pulse-based flip-flop circuit 100 may operate in response to the pulse signal PS that is generated in response to the clock signal CLK and has a fixed pulse width PD. Therefore, as will be described below, a semiconductor integrated circuit (IC) including the pulse-based flip-flop 100 may have a clock jitter absorption characteristic and may allow time borrowing between stages.

Figure 5:
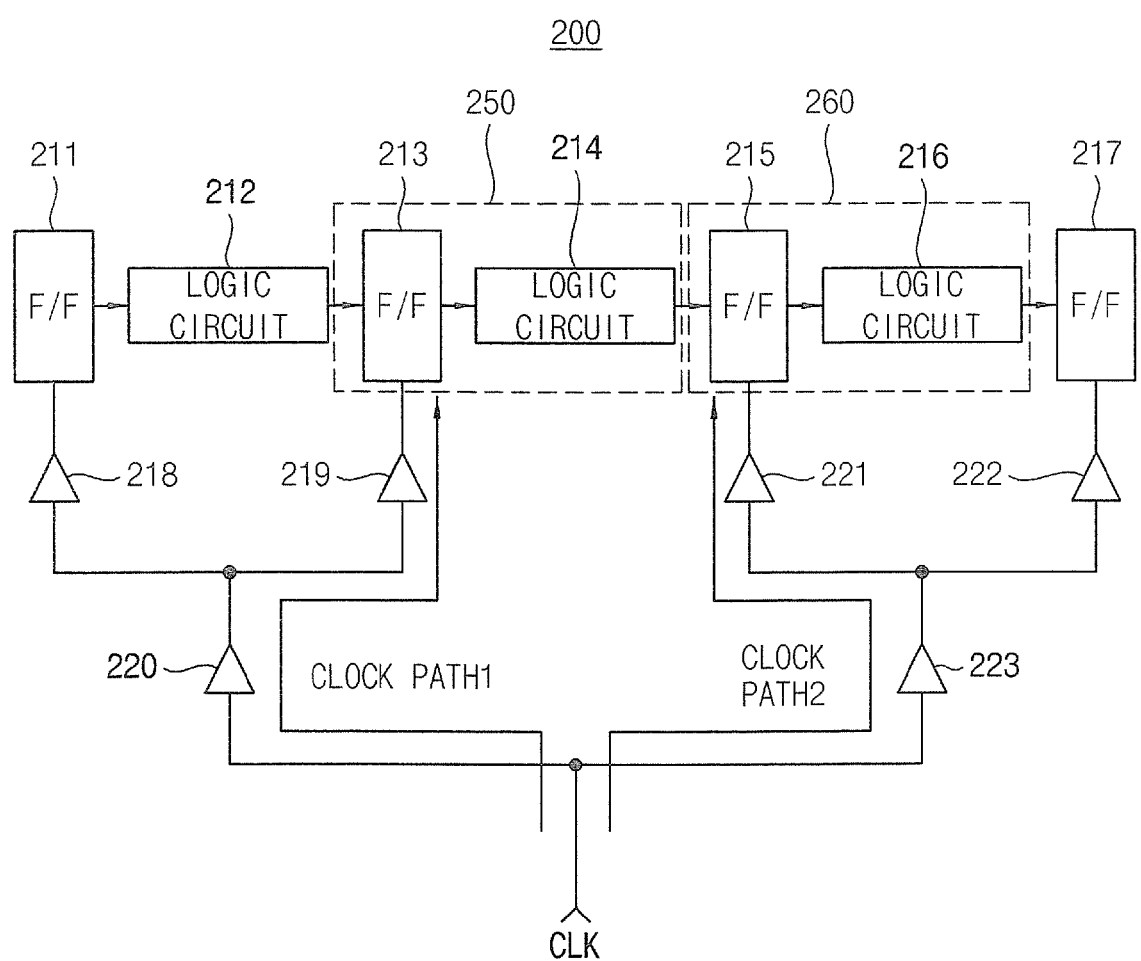
FIG. 5 is a circuit diagram illustrating a semiconductor IC including pulse-based flip-flops.

FIG. 5 is a circuit diagram illustrating a semiconductor IC including pulse-based flip-flops.

Referring to FIG. 5, the semiconductor IC 200 may include flip-flops 211, 213, 215 and 217, logic circuits 212, 214 and 216, and clock buffers 218, 219, 220, 221, 222 and 223. The semiconductor IC 200 may include a plurality of stages having a flip-flop and a logic circuit, and each of the stages may receive the clock signal CLK through respective clock paths CLOCK PATH1 and CLOCK PATH2. FIG. 5 illustrates one data path including a first stage 250 and a second stage 260.

The first stage 250 may include a first flip-flop 213 and a first logic circuit 214. The second stage 260 may include a second flip-flop 215 and a second logic circuit 216. A first buffer 219 and a second buffer 220 may constitute a first clock path CLOCK PATH1, and a third buffer 221 and a fourth buffer 223 may constitute a second clock path CLOCK PATH2. The first flip-flop 213 of the first stage 250 may sample and output an input signal received through an input node of the first flip-flop 213 in response to the clock signal CLK received through the first clock path CLOCK PATH1. The first logic circuit 214 may perform signal process on an output signal of the first flip-flop 213. An output signal of the first logic circuit 214 may be inputted to the second stage 260. The second flip-flop 215 of the second stage 260 may sample and output an input signal received through an input node of the second flip-flop 215 in response to the clock signal CLK received through the second clock path CLOCK PATH2. The second logic circuit 216 may perform signal process on an output signal of the second flip-flop 215 to output the processed signal.

FIGS. 6A to 6C are diagrams illustrating delay times according to an operation condition of a circuit including a flip-flop. FIG. 6A illustrates a delay time of a circuit path according to a circuit design. FIG. 6B illustrates a delay time of a circuit path with consideration of an on-chip-variation of a data signal. FIG. 6C illustrates a delay time of a circuit path with consideration of an on-chip-variation of a data signal, an on-chip-variation of a clock signal and a clock jitter.

Referring to FIG. 6A, the delay time of a circuit path according to a circuit design may include a delay time CQ DELAY from a clock signal to an output signal, a delay time LOGIC DELAY caused by a logic circuit in the data path, and a setup time SETUP TIME of a flip-flop. In FIG. 6A, the delay time of a circuit path according to a circuit design is about 750 ps.

Referring to FIG. 6B, the delay time of a circuit path with consideration of an on-chip-variation of a data signal may include the delay time CQ DELAY from a clock signal to an output signal, a delay time LOGIC DELAY caused by a logic circuit, an on-chip-variation of a data signal DATA OCV, and the setup time SETUP TIME of a flip-flop. In FIG. 6B, the delay time of a circuit path with consideration of an on-chip-variation of a data signal is about 830 ps.

Referring to FIG. 6C, the delay time of a circuit path with consideration of an on-chip-variation of a data signal, an on-chip-variation of a clock signal and a clock jitter may include an on-chip-variation of a first clock signal CK#1 OCV, the delay time CQ DELAY from a clock signal to an output signal, the delay time LOGIC DELAY caused by a logic circuit, the on-chip-variation of a data signal DATA OCV, the setup time SETUP TIME of a flip-flop, an on-chip-variation of a second clock signal CK#2 OCV, and a clock jitter CLOCK JITTER. In FIG. 6C, the delay time of a circuit path with consideration of an on-chip-variation of a data signal, an on-chip-variation of a clock signal and a clock jitter is about 1000 ps.

It is important to minimize the setup time SETUP TIME of a flip-flop and the delay time CQ DELAY from a clock signal to an output signal in order to design a semiconductor chip operating at a high speed.

The on-chip-variations of clock signals CK#1 OCV and CK#2 OCV or the clock jitter CLOCK JITTER may reduce an effective period of a clock signal and thus degrade an overall operating speed of a pipeline of a semiconductor IC.

Figures 7A, 7B, 7C:
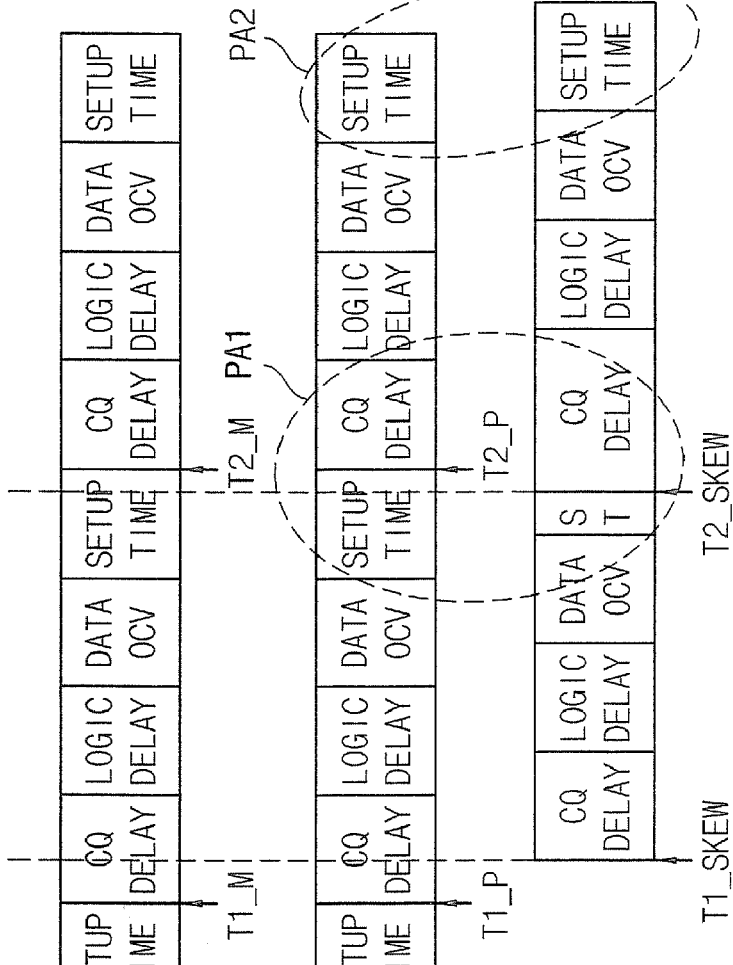
FIGS. 7A to 7C are diagrams illustrating delay times of circuit paths of a semiconductor IC including a flip-flop when a clock skew occurs.

FIGS. 7A to 7C are diagrams illustrating delay times of circuit paths of a semiconductor IC including a flip-flop when a clock skew occurs. In FIGS. 7A to 7C, an on-chip-variation of a clock signal is ignored.

FIG. 7A illustrates a delay time of a circuit path in a pipeline of an ideal semiconductor IC. FIG. 7B illustrates a delay time of a circuit path in a pipeline of a semiconductor IC including the master-slave flip-flop circuit. FIG. 7C illustrates a delay time of a circuit path in a pipeline of a semiconductor IC including the pulse-based flip-flop circuit.

Referring to FIG. 7A, the delay time of a circuit path in a pipeline of an ideal semiconductor IC may include the delay time CQ DELAY from a clock signal to an output signal, the delay time LOGIC DELAY caused by a logic circuit, the on-chip-variation of a data signal DATA OCV, and the setup time SETUP TIME of a flip-flop.

When a clock skew occurs as illustrated in FIG. 7C, a data transmission error may be caused in a pipeline of a semiconductor IC including the master-slave flip-flop circuit because of insufficiency of a cycle time, as illustrated in FIG. 7B. However, since the pulse-based flip-flop circuit has a characteristic of transparency as described above, a data transmission error may be prevented in a pipeline of a semiconductor IC including the pulse-based flip-flop circuit although a cycle time is insufficient, as illustrated in FIG. 7C.

In FIG. 7B, T1_M indicates a time at which a clock signal inputted to a first stage of a semiconductor IC including the master-slave flip-flop circuit is enabled, and T2_M indicates a time at which a clock signal inputted to a second stage of a semiconductor IC including the master-slave flip-flop circuit is enabled. In FIG. 7C, T1_P indicates a time at which a clock signal inputted to a first stage of a semiconductor IC including the pulse-based flip-flop circuit is enabled, T2_P indicates a time at which a clock signal inputted to a second stage of a semiconductor IC including the pulse-based flip-flop circuit is enabled, T1_SKEW indicates a time at which a clock signal inputted to a first stage is enabled when a clock skew occurs, and T2_SKEW indicates a time at which a clock signal inputted to a second stage is enabled when a clock skew occurs.

The master-slave flip-flop circuit does not have a characteristic of transparency since the master-slave flip-flop circuit operates in synchronization with an edge of a clock signal. When a clock skew is occurred in a semiconductor IC including the master-slave flip-flop circuit, a cycle time becomes T2_SKEW−T1_SKEW that is shorter than a cycle time of a semiconductor IC including the master-slave flip-flop circuit, that is, T2_M−T1_M. Therefore, a data transmission error may be caused in a semiconductor IC including the master-slave flip-flop circuit.

When a clock skew occurs in a semiconductor IC including the pulse-based flip-flop circuit, a cycle time becomes T2_SKEW−T1_SKEW that is shorter than a cycle time of a semiconductor IC including the pulse-based flip-flop circuit, that is, T2_P−T1_P. However, since the pulse-based flip-flop circuit has a characteristic of transparency, a data transmission error may not be caused in a semiconductor IC including the pulse-based flip-flop circuit.

Referring to a first portion PA1 of FIG. 7C, a delay time DQ DELAY from an input signal to an output signal, which includes the setup time SETUP TIME and the CQ DELAY, remains substantially constant although a clock skew occurs, since the CQ DELAY is increased by a decreased amount of a setup time SETUP TIME. Referring to a second portion PA2 of FIG. 7C, the setup time SETUP TIME may not be decreased in a non-critical path.

Figure 8:
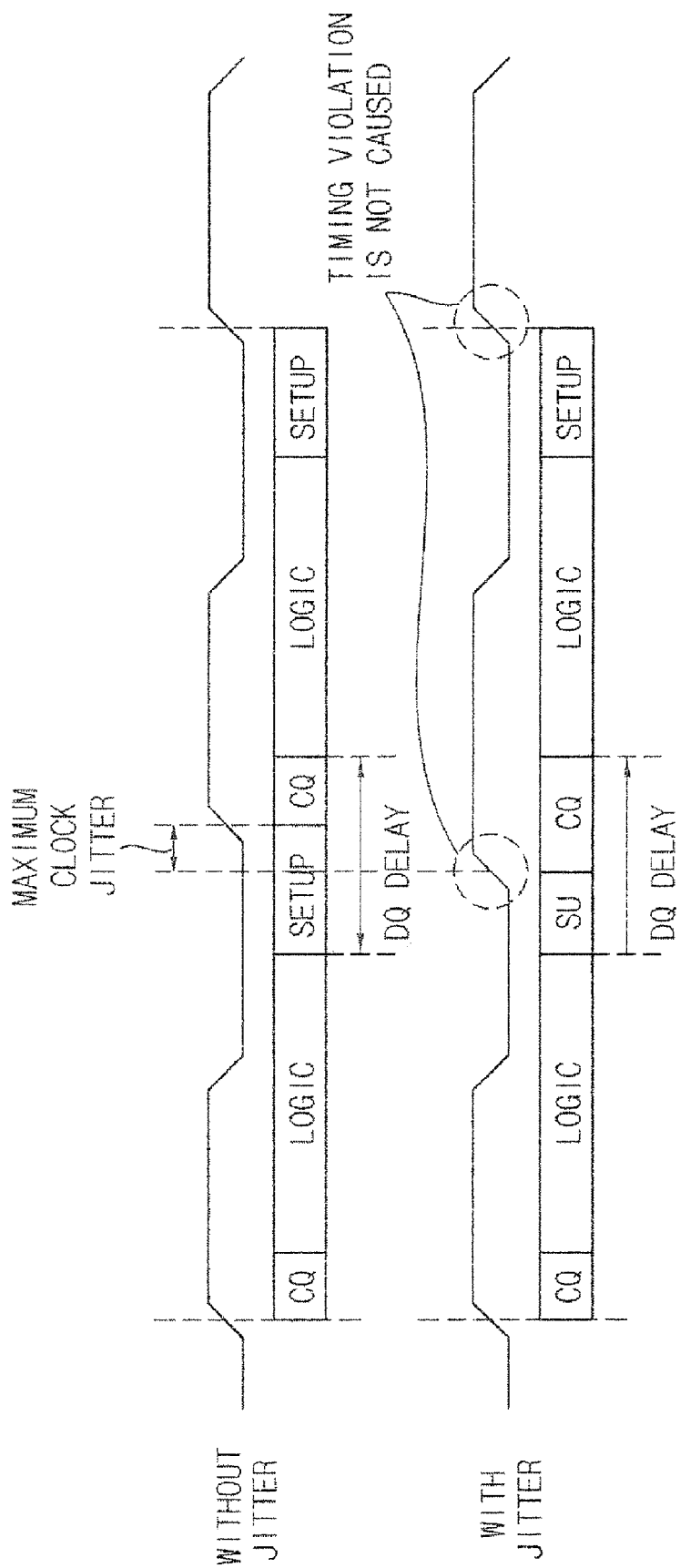
FIG. 8 is a diagram for describing a clock jitter absorption characteristic of a semiconductor IC including a pulse-based flip-flop circuit.

FIG. 8 is a diagram for describing a clock jitter absorption characteristic of a semiconductor IC including the pulse-based flip-flop circuit.

Referring to FIG. 8, when a clock jitter occurs, a setup time SETUP is decreased and a delay time CQ from a clock signal to an output signal is increased compared with the case when a clock jitter does not occur. However, the delay time DQ DELAY from an input signal to an output signal remains substantially constant. A timing violation may not be caused and a data transmission may be performed without an error, since the pulse-based flip-flop circuit has a characteristic of transparency.

As will be described below, when the setup time SETUP goes on decreasing, the DQ DELAY may be increased at some point. As illustrated in FIG. 8, a maximum clock jitter MAXIMUM CLOCK JITTER is related to a decreased amount of the setup time SETUP.

Figure 9:
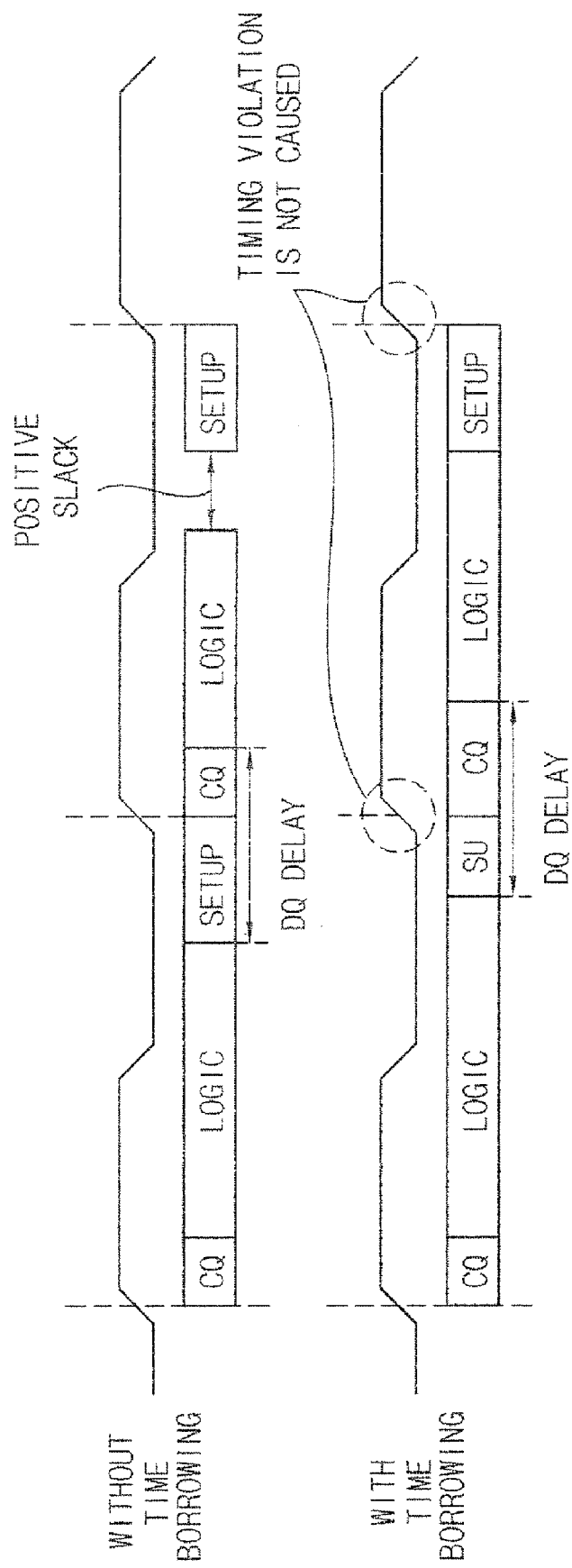
FIG. 9 is a diagram for describing a time borrowing in a semiconductor IC including a pulse-based flip-flop circuit.

FIG. 9 is a diagram for describing a time borrowing in a semiconductor IC including the pulse-based flip-flop circuit.

Referring to FIG. 9A, when a positive slack exists in a second stage of a semiconductor IC including the pulse-based flip-flop circuit, a first stage of a semiconductor IC including the pulse-based flip-flop circuit may borrow a time of the positive slack from the second stage. When a positive slack exists in a pipeline, a timing violation may not be caused and a data transmission may be performed without an error although a time borrowing is performed, since the pulse-based flip-flop circuit has a characteristic of transparency.

Figure 10:
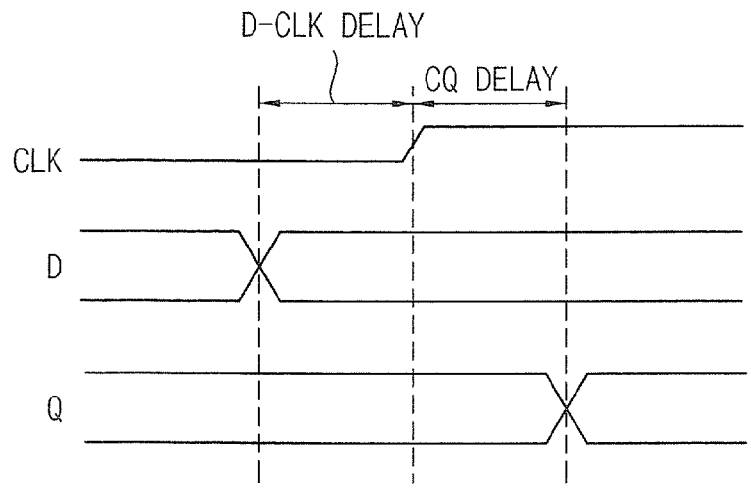
FIG. 10 is a timing diagram for describing a measurement of setup time of a pulse-based flip-flop circuit.

FIG. 10 is a timing diagram for describing a measurement of setup time of the pulse-based flip-flop circuit.

Referring to FIG. 10, a delay time from an input signal D to a clock signal CLK is D-CLK DELAY and a delay time from a clock signal CLK to an output signal Q is CQ DELAY. A delay time from the input signal D to the output signal Q is DQ DELAY.

There is a period when the DQ DELAY remains substantially constant since the CQ DELAY is increased by a decreased amount of the D-CLK DELAY The period may be defined as a transparent period or a width of transparency of the pulse-based flip-flop circuit.

In the above description, the D-CLK DELAY is regarded as setup time. However, a method of measuring setup time is required in order to represent a characteristic of transparency of the pulse-based flip-flop circuit accurately in a technical field of a standard cell library.

As described above, the pulse-based flip-flop circuit has a characteristic of transparency since the pulse-based flip-flop circuit operates depending on a voltage level corresponding to an ON period of a pulse signal which is generated in response to a clock signal and has a fixed pulse width.

Figure 11:
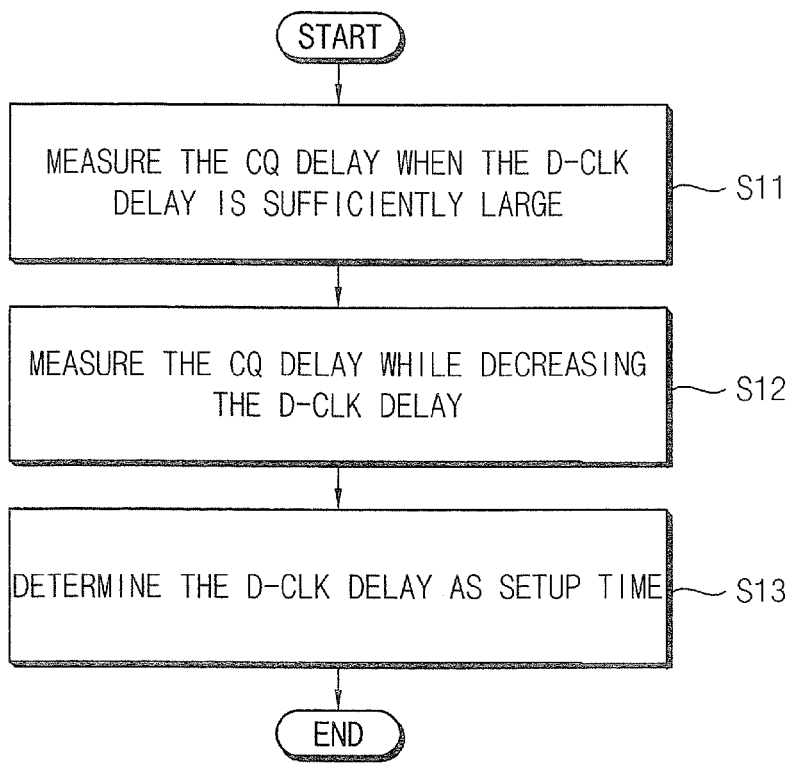
FIG. 11 is a flow chart illustrating a method of measuring setup time according to a first example embodiment.

FIG. 11 is a flow chart illustrating a method of measuring setup time according to a first example embodiment.

Referring to FIG. 11, the CQ DELAY is measured when the D-CLK DELAY is sufficiently large (step S11), the CQ DELAY is measured while decreasing the D-CLK DELAY (step S12), and the D-CLK DELAY, at which the CQ DELAY is increased by 10% from an initial CQ DELAY, is determined as setup time (step S13).

Figure 12:
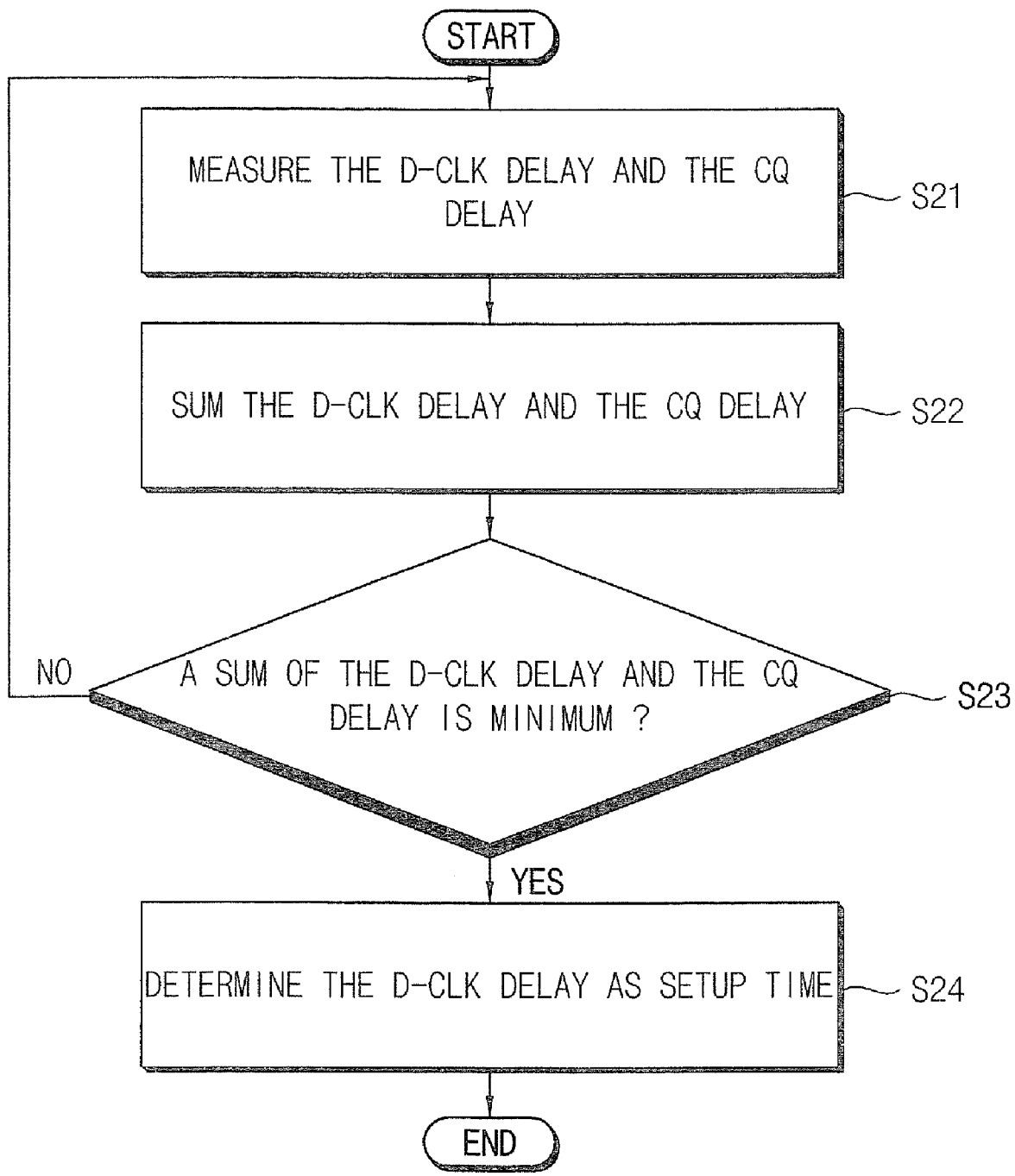
FIG. 12 is a flow chart illustrating a method of measuring setup time according to a second example embodiment.

FIG. 12 is a flow chart illustrating a method of measuring setup time according to a second example embodiment.

Referring to FIG. 12, the D-CLK DELAY and the CQ DELAY are measured (step S21), the D-CLK DELAY and the CQ DELAY are summed (step S22), it is determined whether the sum of the D-CLK DELAY and the CQ DELAY is minimum (step S23), the step S21 is performed when the sum of the D-CLK DELAY and the CQ DELAY is not minimum, and the D-CLK DELAY is determined as setup time when the sum of the D-CLK DELAY and the CQ DELAY is minimum (step S24).

Figure 13:
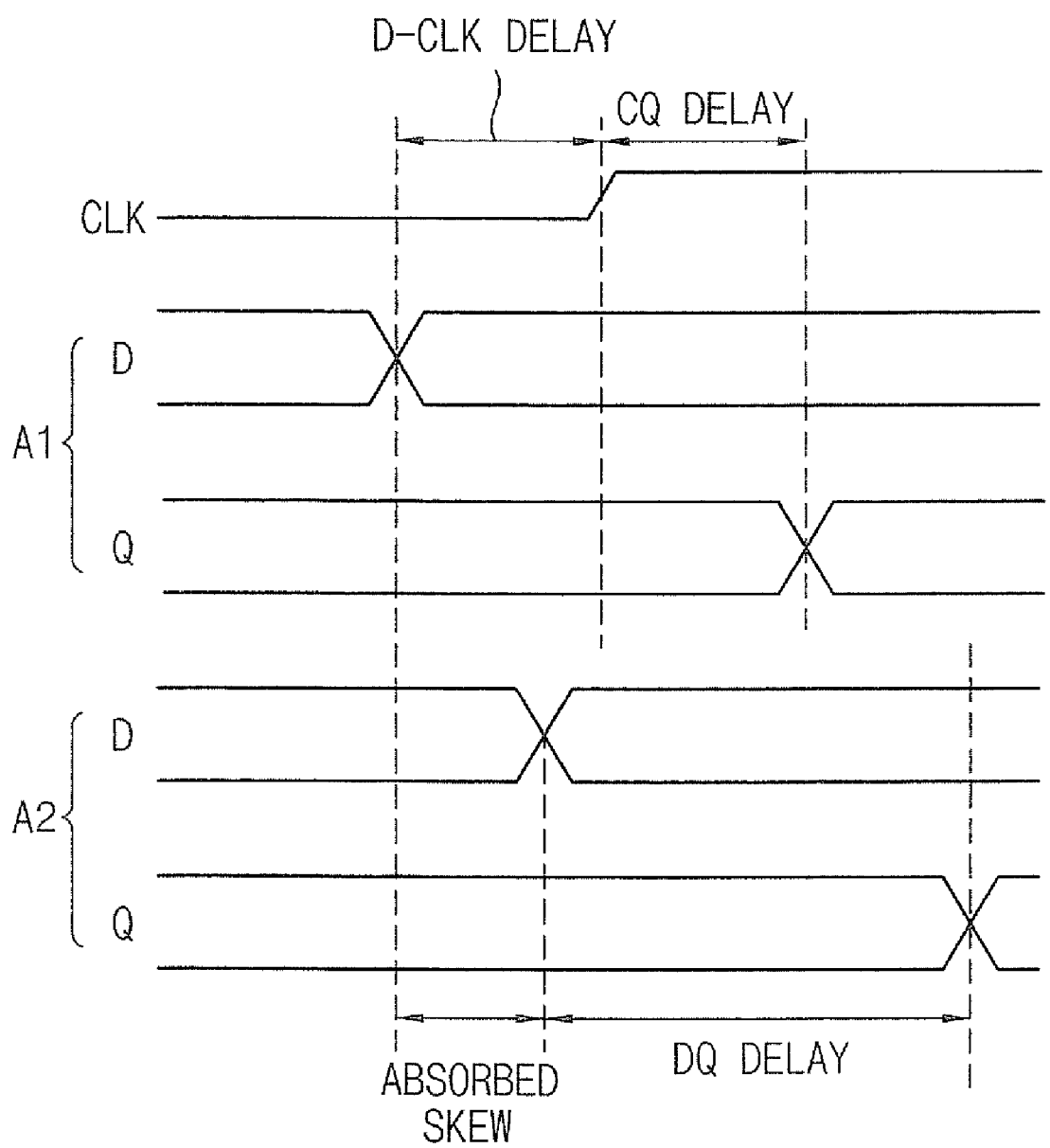
FIG. 13 is a timing diagram for describing a measurement of setup time of a pulse-based flip-flop circuit.

FIG. 13 is a timing diagram for describing a measurement of setup time of the pulse-based flip-flop circuit. In FIG. 13, A1 illustrates waveforms of the input signal D and the output signal Q when a clock skew does not occur, and A2 illustrates waveforms of the input signal D and the output signal Q when a clock skew occurs.

Referring to FIG. 13, the DQ DELAY remains substantially constant although a clock skew occurs, since the D-CLK DELAY is decreased and the CQ DELAY is increased by a decreased amount of the D-CLK DELAY. When a clock skew occurs, the decreased amount of the D-CLK DELAY is an absorbed clock skew ABSORBED SKEW.

Figure 14:
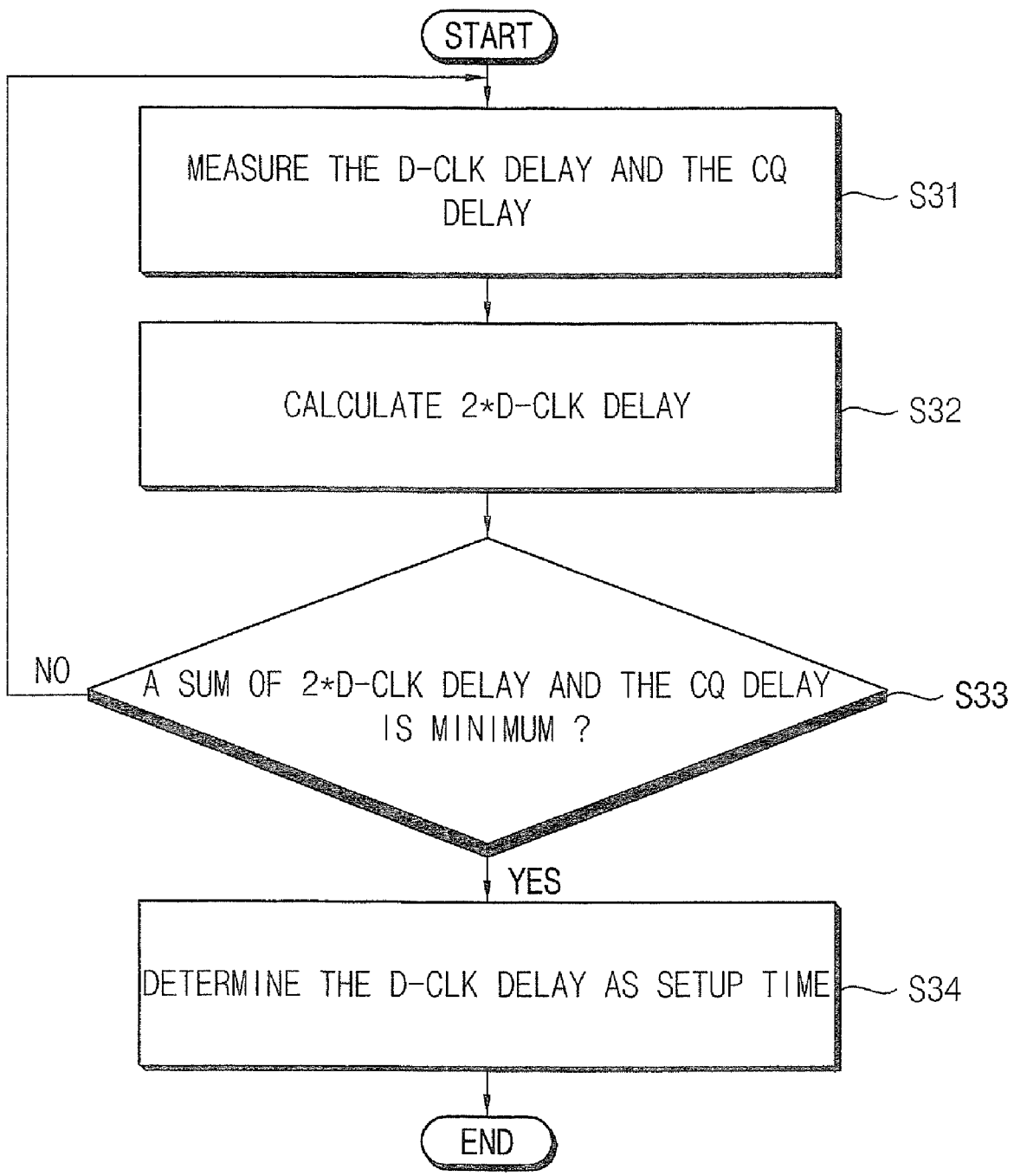
FIG. 14 is a flow chart illustrating a method of measuring setup time according to a third example embodiment.

FIG. 14 is a flow chart illustrating a method of measuring setup time according to a third example embodiment.

Referring to FIG. 14, the D-CLK DELAY and the CQ DELAY are measured (step S31), 2*D-CLK DELAY is calculated by multiplying D-CLK DELAY by two (step S32), it is determined whether a sum of 2*D-CLK DELAY and the CQ DELAY is minimum (step S33), the step S31 is performed when the sum of 2*D-CLK DELAY and the CQ DELAY is not minimum, and the D-CLK DELAY is determined as setup time when the sum of 2*D-CLK DELAY and the CQ DELAY is minimum (step S34).

Figure 15:
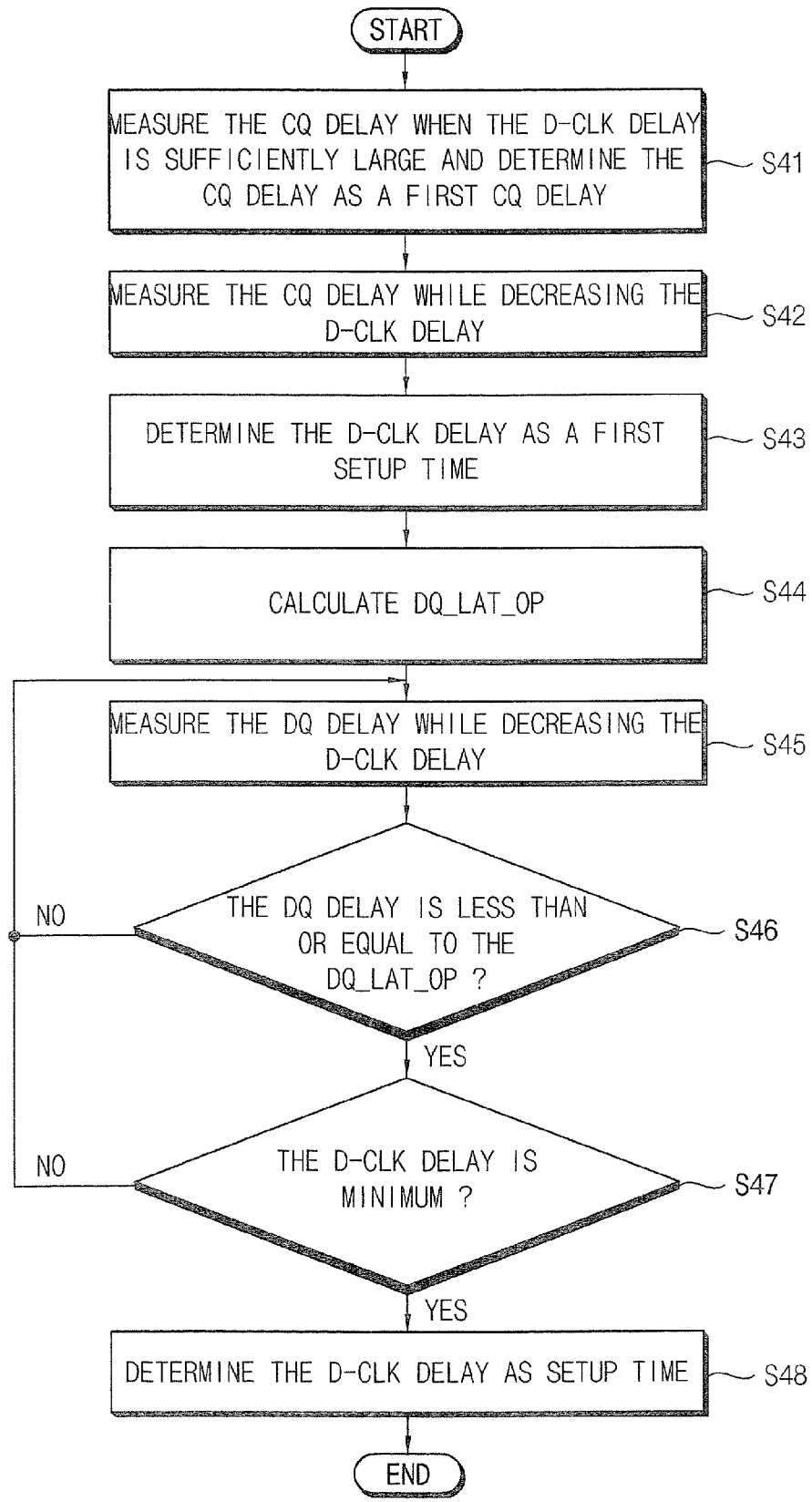
FIG. 15 is a flow chart illustrating a method of measuring setup time according to a fourth example embodiment.

FIG. 15 is a flow chart illustrating a method of measuring setup time according to a fourth example embodiment.

Referring to FIG. 15, the CQ DELAY is measured when the D-CLK DELAY is sufficiently large and the measured CQ DELAY is determined as a first CQ delay (step S41), the CQ DELAY is measured while decreasing the D-CLK DELAY (step S42), the D-CLK DELAY, at which the CQ DELAY is increased by 10% from the first CQ delay, is determined as a first setup time (step S43), a DQ_LAT_OP is calculated by adding the first CQ delay multiplied by 1.1 to the first setup time (step S44), the DQ DELAY is measured while decreasing the D-CLK DELAY (step S45), it is determined whether the DQ DELAY is less than or equal to the DQ_LAT_OP (step S46), the step S45 is performed when the DQ DELAY is greater than the DQ_LAT_OP and it is determined whether the D-CLK DELAY is minimum (step S47) when the DQ DELAY is less than or equal to the DQ_LAT_OP, and the step S45 is performed when the D-CLK DELAY is not minimum and the D-CLK DELAY is determined as setup time (step S48) when the D-CLK DELAY is minimum.

Figure 16:
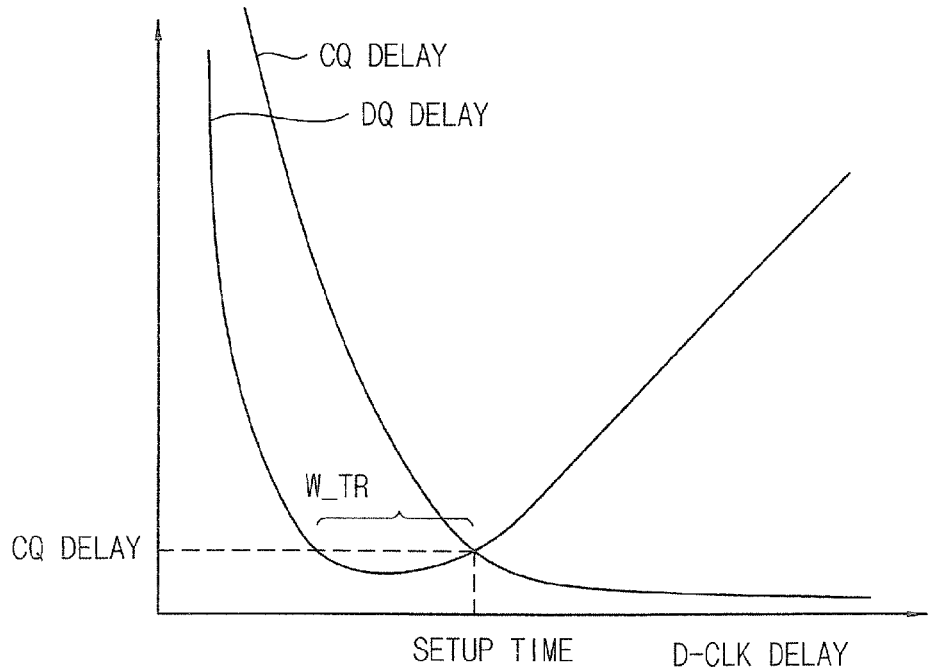
FIG. 16 is a graph for describing a characteristic of transparency of a pulse-based flip-flop circuit.

FIG. 16 is a graph for describing a characteristic of transparency of the pulse-based flip-flop circuit. In FIG. 16, x-axis illustrates the D-CLK DELAY, and y-axis illustrates the CQ DELAY and the DQ DELAY.

Referring to FIG. 16, when the D-CLK DELAY is decreasing, the CQ DELAY increases slowly until a setup time SETUP TIME and increases rapidly after the setup time SETUP TIME. When the D-CLK DELAY is decreasing, the DQ DELAY decreases rapidly until the setup time SETUP TIME, remains substantially constant after the setup time SETUP TIME during a first time duration, and increases rapidly after the first time duration. The first time duration corresponds to a width of transparency or a transparent period W_TR of the pulse-based flip-flop circuit. During the first time duration W_TR, the DQ DELAY remains substantially constant since the CQ DELAY is increased by a decreased amount of the D-CLK DELAY.

Figure 17:
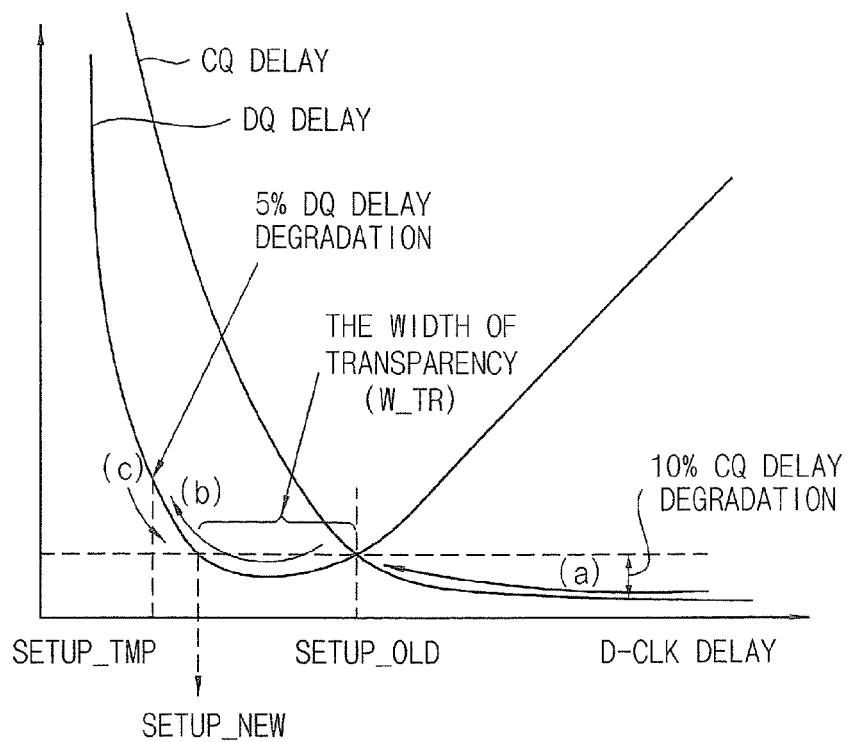
FIG. 17 is a graph for describing a measurement of setup time of a pulse-based flip-flop circuit.

FIG. 17 is a graph for describing a measurement of setup time of the pulse-based flip-flop circuit.

Figure 18:
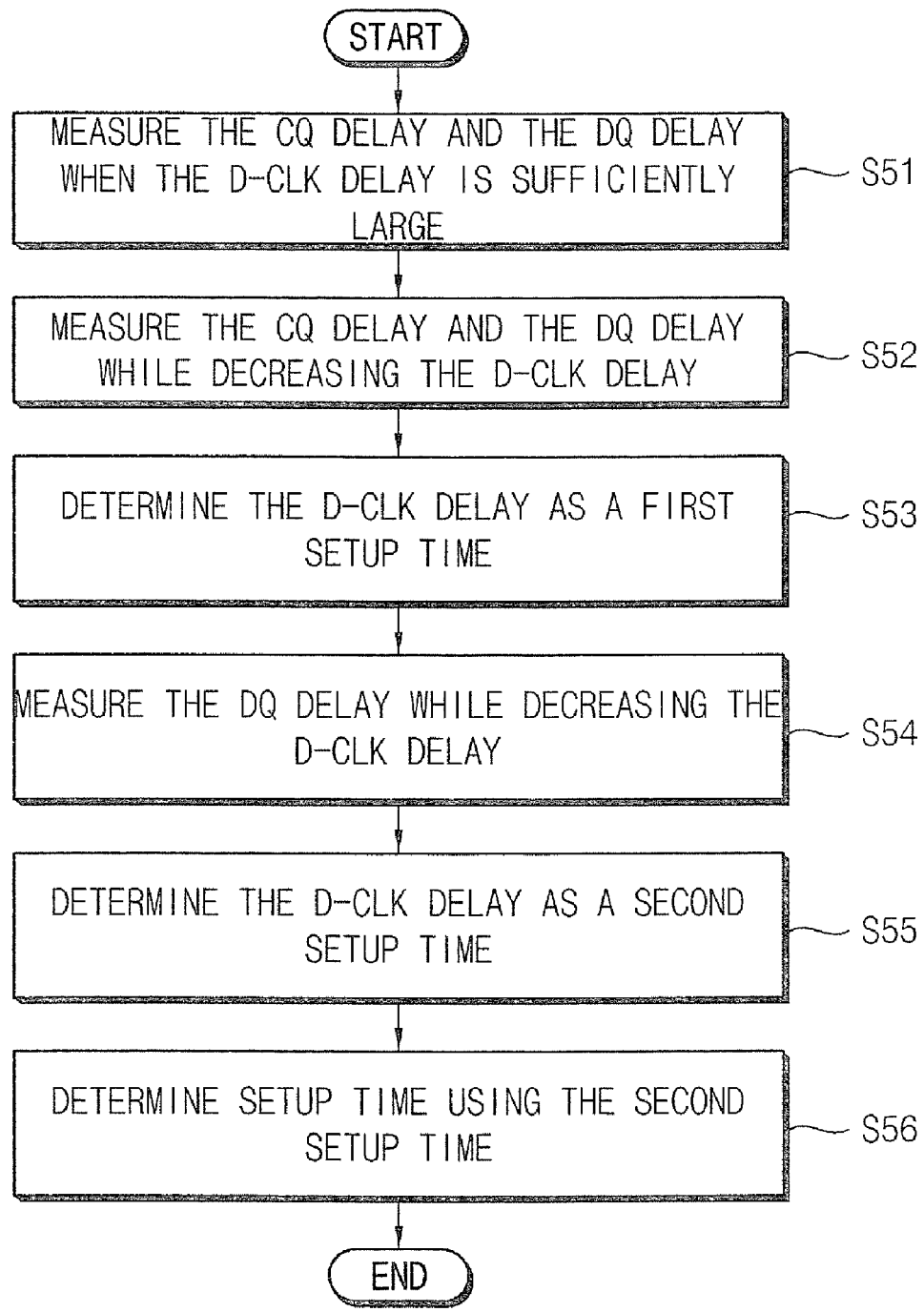
FIG. 18 is a flow chart illustrating a method of measuring setup time according to a fifth example embodiment.

FIG. 18 is a flow chart illustrating a method of measuring setup time according to a fifth example embodiment.

Referring to FIGS. 17 and 18, the CQ DELAY and the DQ DELAY are measured when the D-CLK DELAY is sufficiently large (step S51), the CQ DELAY and the DQ DELAY are measured while decreasing the D-CLK DELAY (step S52), the D-CLK DELAY, at which the CQ DELAY is increased by 10% from an initial CQ delay, is determined as a first setup time SETUP_OLD (illustrated in FIG. 17 by (a)) (step S53), the DQ DELAY is measured while decreasing the D-CLK DELAY (step S54), the D-CLK DELAY, at which the DQ DELAY is increased by 5% from the value when the D-CLK DELAY is at the first setup time SETUP_OLD, is determined as a second setup time SETUP_TMP (illustrated in FIG. 17 by (b)) (step S55), and a sum of the second setup time SETUP_TMP and a time which is taken for the DQ DELAY to decrease by 5% from the value when the D-CLK DELAY is at the second setup time SETUP_TMP is determined as a third setup time SETUP_NEW (illustrated in FIG. 17 by (c)) (step S56).

FIGS. 19A to 19C are tables illustrating measurement results of setup time and the width of transparency of the pulse-based flip-flop circuit using a method of FIGS. 17 and 18.

FIGS. 19A to 19C illustrate a measuring result of setup time and the width of transparency for three clock signals CLK that have respective transition times different from each other and three input signal D that have respective transition times different from each other.

For example, when a transition time of a clock signal CLK is 56 ps and a transition time of an input signal D is 19 ps, the first setup time SETUP_OLD is −39 ps, the third setup time SETUP_NEW is −188 ps and the width of transparency W_TR is 141 ps.

Figure 20:
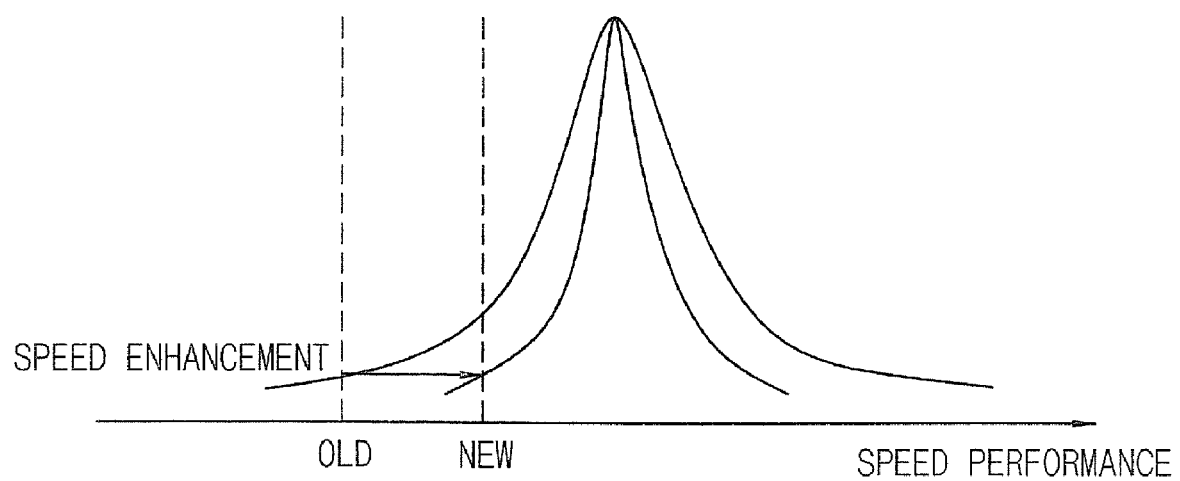
FIG. 20 is a graph illustrating a distribution of operating speeds of semiconductor chips when a semiconductor IC is designed by using a characteristic of transparency of a pulse-based flip-flop circuit.

FIG. 20 is a graph illustrating a distribution of operating speeds of semiconductor chips when a semiconductor IC is designed by using a characteristic of transparency of the pulse-based flip-flop circuit.

In FIG. 20, NEW illustrates a minimum operating speed of semiconductor chips when a semiconductor IC is designed by using a method of measuring setup time representing a characteristic of transparency of the pulse-based flip-flop circuit, and OLD illustrates a minimum operating speed of semiconductor chips when a semiconductor IC is designed without consideration of a characteristic of transparency of the pulse-based flip-flop circuit.

As illustrated in FIG. 20, when the pulse-based flip-flop circuit having a characteristic of transparency is used in designing a semiconductor IC, a distribution of operating speeds of semiconductor chips may be reduced and a minimum operating speed of semiconductor chips may be increased.

Measuring setup time accurately is important for determining the width of transparency of the pulse-based flip-flop circuit.

As described above, since setup time is related to the width of transparency of the pulse-based flip-flop circuit, when setup time is determined and controlled accurately, a clock jitter may be absorbed and a time borrowing between adjacent pipelines may be allowed.

Example embodiments of the present inventive concept may be used in designing a semiconductor IC, and, in particular, may be used in designing a semiconductor IC including the pulse-based flip-flop circuit.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of measuring setup time of a pulse-based flip-flop using an integrated circuit design apparatus, comprising:
    measuring, using a computer, a first delay time from an input signal to a clock signal and a second delay time from the clock signal to an output signal; and
    determining, using said computer, a setup time using the first delay time and the second delay time,
    wherein measuring the first delay time and the second delay time includes:
    measuring the second delay time when the first delay time is sufficiently large and determining the second delay time as an initial second delay time; and
    measuring the second delay time while decreasing the first delay time.

2. The method of claim 1, wherein the first delay time, at which the second delay time is increased by 10% from the initial second delay time, is determined as the setup time.

3. The method of claim 1, wherein determining the second delay time as an initial second delay time comprises determining the second delay time as a first CQ delay.

4. The method of claim 3, wherein determining the setup time includes:
    determining the first delay time, at which the second delay time is increased by 10% from the first CQ delay, as a first setup time;
    determining a temporary delay time by adding the first CQ delay multiplied by 1.1 to the first setup time;
    measuring a third delay time from the input signal to the output signal while decreasing the first delay time;
    determining whether the third delay time is less than or equal to the temporary delay time;
    re-measuring the third delay time when the third delay time is greater than the temporary delay time;

determining whether the first delay time is minimum when the third delay time is less than or equal to the temporary delay time;

re-measuring the third delay time when the first delay time is not minimum; and determining the first delay time as the setup time when the first delay time is minimum.

5. A method of measuring setup time of a pulse-based flip-flop using an integrated circuit design apparatus, comprising:

measuring a first delay time from an input signal to a clock signal and a second delay time from the clock signal to an output signal; and measuring, using a computer, a setup time using the first delay time and the second delay time, wherein determining the setup time includes:

summing the first delay time and the second delay time;

determining, using said computer, whether the sum of the first delay time and the second delay time is minimum;

re-measuring the first delay time and the second delay time when the sum of the first delay time and the second delay time is not minimum; and determining the first delay time as the setup time when the sum of the first delay time and the second delay time is minimum.

6. The method of claim 5, wherein:

determining the setup time further includes multiplying the first delay time by two;

determining whether the sum of the first delay time and the second delay time is minimum comprises determining whether a sum of two times of the first delay time and the second delay time is minimum;

re-measuring the first delay time and the second delay time when the sum of the first delay time and the second delay time is not minimum comprises re-measuring the first delay time and the second delay time when the sum of two times of the first delay time and the second delay time is not minimum; and determining the first delay time as the setup time when the sum of the first delay time and the second delay time is minimum comprises determining the first delay time as the setup time when the sum of two times of the first delay time and the second delay time is minimum.

7. A method of measuring setup time of a pulse-based flip-flop using an integrated circuit design apparatus, comprising:

measuring, using a computer, a first delay time from an input signal to a clock signal, a second delay time from the clock signal to an output signal, and a third delay time from the input signal to the output signal; and determining, using said computer, a setup time using the first delay time, the second delay time, and the third delay time, wherein measuring the first delay time, the second delay time, and the third delay time includes:

measuring the second delay time and the third delay time when the first delay time is sufficiently large and determining the second delay time as an initial second delay time; and measuring the second delay time and the third delay time while decreasing the first delay time.

8. The method of claim 7, wherein determining the setup time includes:

determining the first delay time, at which the second delay time is increased by 10% from the initial second delay time, as a first setup time;

measuring the third delay time while decreasing the first delay time, determining the first delay time, at which the third delay time is increased by 5% from the value when the first delay time is at the first setup time, as a second setup time; and determining a sum of the second setup time and a time, which is taken for the third delay time to decrease by 5% from the value when the first delay time is at the second setup time, as the setup time.

* * * * *